(12) United States Patent
Armstrong

(10) Patent No.: US 7,884,998 B2
(45) Date of Patent: Feb. 8, 2011

(54) CATADIOPTRIC MICROSCOPE OBJECTIVE EMPLOYING IMMERSION LIQUID FOR USE IN BROAD BAND MICROSCOPY

(75) Inventor: J. Joseph Armstrong, Milpitas, CA (US)

(73) Assignee: KLA - Tencor Corporation, Milpitas, CA (US)

( * ) Notice: Subject to any disclaimer, the term of this patent is extended or adjusted under 35 U.S.C. 154(b) by 0 days.

(21) Appl. No.: 11/818,448

(22) Filed: Jun. 14, 2007

(65) Prior Publication Data
US 2008/0247036 A1    Oct. 9, 2008

Related U.S. Application Data

(63) Continuation-in-part of application No. 10/812,111, filed on Mar. 29, 2004, now Pat. No. 7,307,783, and a continuation-in-part of application No. 10/646,073, filed on Aug. 22, 2003, which is a continuation-in-part of application No. 10/434,374, filed on May 7, 2003, now Pat. No. 7,180,658.

(60) Provisional application No. 60/449,326, filed on Feb. 21, 2003.

(51) Int. Cl.
*G02B 17/08* (2006.01)
*G02B 21/04* (2006.01)

(52) U.S. Cl. ..................................................... 359/366
(58) Field of Classification Search .................. 359/366, 359/364, 365
See application file for complete search history.

(56) References Cited

U.S. PATENT DOCUMENTS

| | | | |
|---|---|---|---|
| 1,973,066 A | 9/1934 | Hauser et al. | |
| 2,661,658 A | 12/1953 | Dyson | |
| 3,237,515 A | 3/1966 | Altman | |
| 4,108,794 A | * 8/1978 | Yonekubo | ................. 252/408.1 |
| 4,155,630 A | 5/1979 | Ih | |
| 4,511,220 A | 4/1985 | Scully | |
| 4,647,158 A | 3/1987 | Yeadon | |
| 4,758,088 A | 7/1988 | Doyle | |
| 4,779,966 A | 10/1988 | Friedman | |
| 4,795,244 A | 1/1989 | Uehara | |

(Continued)

FOREIGN PATENT DOCUMENTS

DE              108181        1/1900

(Continued)

OTHER PUBLICATIONS

M.R. Bartz et al., "LED Print Analyzer," IBM Technical Disclosure Bulletin, vol. 14, No. 3, Aug. 1971.

(Continued)

*Primary Examiner*—Joshua L Pritchett
(74) *Attorney, Agent, or Firm*—Smyrski Law Group, A P.C.

(57) ABSTRACT

An objective for imaging specimens is disclosed. The objective receives light energy from a light energy source configured to provide light energy in a wavelength range of approximately 480 to 660 nanometers, employs a Mangin mirror arrangement in conjunction with an immersion liquid to provide a numerical aperture in excess of 1.0 and a field size in excess of 0.05 millimeters, where every element in the objective has a diameter of less than approximately 40 millimeters.

33 Claims, 10 Drawing Sheets

U.S. PATENT DOCUMENTS

| | | | |
|---|---|---|---|
| 4,898,471 | A | 2/1990 | Stonestrom et al. |
| 4,971,428 | A | 11/1990 | Moskovich |
| 4,974,094 | A | 11/1990 | Morito |
| 5,031,976 | A | 7/1991 | Shafer |
| 5,089,913 | A | 2/1992 | Singh et al. |
| 5,114,238 | A | 5/1992 | Sigler |
| 5,140,459 | A | 8/1992 | Sagan |
| 5,162,939 | A | 11/1992 | Herron et al. |
| 5,177,559 | A | 1/1993 | Batchelder et al. |
| 5,233,460 | A | 8/1993 | Partlo |
| 5,264,912 | A | 11/1993 | Vaught et al. |
| 5,274,494 | A | 12/1993 | Rafanelli et al. |
| 5,309,456 | A | 5/1994 | Horton |
| 5,323,263 | A | 6/1994 | Schoenmakers |
| 5,337,170 | A | 8/1994 | Khoury et al. |
| 5,428,442 | A | 6/1995 | Lin et al. |
| 5,434,662 | A | 7/1995 | Rockwell et al. |
| 5,488,229 | A | 1/1996 | Elliott et al. |
| 5,515,207 | A | 5/1996 | Foo |
| 5,621,529 | A | 4/1997 | Gordon et al. |
| 5,636,066 | A | 6/1997 | Takahashi |
| 5,644,140 | A | 7/1997 | Biedermann et al. |
| 5,668,673 | A | 9/1997 | Suenaga et al. |
| 5,717,518 | A | 2/1998 | Shafer et al. |
| 5,729,374 | A | 3/1998 | Tiszauer et al. |
| 5,805,334 | A | 9/1998 | Takahashi |
| 5,805,357 | A | 9/1998 | Omura |
| 5,808,797 | A | 9/1998 | Bloom et al. |
| 5,808,805 | A | 9/1998 | Takahashi |
| 5,835,275 | A | 11/1998 | Takahashi et al. |
| 5,849,468 | A | 12/1998 | Sawyer |
| 5,851,740 | A | 12/1998 | Sawyer |
| 5,861,997 | A | 1/1999 | Takahashi |
| 5,880,891 | A | 3/1999 | Furter |
| 5,990,983 | A | 11/1999 | Hargis et al. |
| 5,999,310 | A | 12/1999 | Shafer et al. |
| 6,064,517 | A | 5/2000 | Chuang et al. |
| 6,191,887 | B1 | 2/2001 | Michaloski et al. |
| 6,275,514 | B1 | 8/2001 | Katzir et al. |
| 6,370,178 | B1 | 4/2002 | Papayoanou et al. |
| 6,392,793 | B1 | 5/2002 | Chuang et al. |
| 6,483,638 | B1 * | 11/2002 | Shafer et al. ............ 359/351 |
| 6,512,631 | B2 | 1/2003 | Shafer et al. |
| 6,548,797 | B1 | 4/2003 | Ai |
| 6,560,011 | B2 | 5/2003 | Chuang et al. |
| 6,801,357 | B2 | 10/2004 | Shafer et al. |
| 6,842,298 | B1 | 1/2005 | Shafer et al. |
| 7,035,001 | B2 | 4/2006 | Chuang et al. |
| 7,136,159 | B2 | 11/2006 | Tsai et al. |
| 7,136,234 | B2 | 11/2006 | Shafer et al. |
| 7,180,658 | B2 | 2/2007 | Shafer et al. |
| 7,187,500 | B2 | 3/2007 | Chuang et al. |
| 2001/0040722 | A1 * | 11/2001 | Shafer et al. ............ 359/351 |
| 2005/0152027 | A1 | 7/2005 | Armstrong et al. |
| 2005/0225881 | A1 * | 10/2005 | Vizgaitis ............ 359/729 |
| 2006/0238856 | A1 | 10/2006 | Shafer et al. |
| 2007/0024961 | A1 | 2/2007 | Shafer et al. |
| 2007/0121107 | A1 | 5/2007 | Tsai et al. |

FOREIGN PATENT DOCUMENTS

| | | |
|---|---|---|
| DE | 3742806 A | 7/1989 |
| EP | 0798585 A2 | 10/1997 |
| GB | 2269024 A | 1/1994 |
| WO | WO 97/12226 | 4/1997 |
| WO | WO 99/08134 | 2/1999 |

OTHER PUBLICATIONS

D.S. Goodman, "Darkfield Illuminator Attachment," IBM Technical Disclosure Bulletin, vol. 27, No. 5, Oct. 1984.

J.L.C. Sanz et al., "Automated Visual Inspection with Dark-Field Microscopy," Journal of the Optical Society of America, Nov. 1985, USA, vol. 2, No. 11, pp. 1857-1862.

Carl Zeiss Brochure, "MSM 193 Microlithography Simulation Microscope," 1999.

* cited by examiner

CATADIOPTRIC MICROSCOPE OBJECTIVE EMPLOYING IMMERSION LIQUID FOR USE IN BROAD BAND MICROSCOPY

This application is a continuation-in-part of co-pending U.S. patent application Ser. No. 10/646,073, entitled "Catadioptric Imaging System for Broad Band Microscopy," inventors David G. Shafer, et al., filed Aug. 22, 2003, which is a continuation-in-part of U.S. patent application Ser. No. 10/434,374, entitled "High Performance Catadioptric Imaging System," inventors David G. Shafer, et al., filed May 7, 2003 now U.S. Pat. No. 7,180,658, which claims the benefit of U.S. Provisional Patent Application Ser. No. 60/449,326, entitled "High Performance, Low Cost Catadioptric Imaging System," filed Feb. 21, 2003, and this application is also a continuation-in-part of co-pending U.S. patent application Ser. No. 10/812,111, entitled "Catadioptric Imaging System Employing Immersion Liquid for use in Broad Band Microscopy," inventors J. Joseph Armstrong et al., filed Mar. 29, 2004 now U.S. Pat. No. 7,307,783. All these applications are incorporated herein by reference.

BACKGROUND OF THE INVENTION

1. Field of the Invention

The present invention relates generally to the field of optical imaging and more particularly to catadioptric optical systems used for microscopic imaging, inspection, and lithography applications.

2. Description of the Related Art

Currently available optical systems have the ability to inspect or image features on the surface of a specimen, such as inspecting defects on a semiconductor wafer or photomask, or alternately examining a biological specimen on a slide. Microscopes have been used in various imaging situations, including biology, metrology, semiconductor inspection, and other complex inspection applications where high resolution images of small areas and/or features are desired.

Typically available imaging systems include microscopes, which offer inspection using dry imaging, or imaging in a gaseous medium such as air. Certain newer applications may benefit from immersion imaging. Unlike dry imaging, immersion imaging immerses the sample in water or other liquid and images or inspects the image within the liquid. Immersion imaging can, in certain circumstances, provide increased optical properties, including but not limited to enhanced resolution, over dry imaging. Furthermore, due to the nature and fragile properties associated with certain biological specimens, biological imaging systems frequently cannot use dry imaging whatsoever. In this situation, a biological imaging system can only image a sample while the sample is immersed in liquid, necessitating the use of a system able to perform immersion imaging.

Problems with immersion imaging and objectives employed within immersion imaging systems include the ability to resolve the image using immersion imaging operation in the presence of either low wavelength or broad wavelength range light energy, or in the presence of different types of illumination and imaging modes. Further, immersion techniques cannot be universally employed with objectives available in standard equipment, such as microscopes.

Microscopes designed to support immersion imaging can be difficult to design for high resolution specimen imaging. To improve the quality of the image received, such a system may use various imaging modes to enhance the appearance of desired features on the specimen. Imaging modes used in an immersion imaging system may include bright field, dark field, differential interference contrast, confocal, and other imaging modes offering different benefits depending on the type of specimen, the features on the specimen being observed, the imaging environment, and other related considerations. Simply employing an immersion substance with an existing objective can, in many cases, provide less than acceptable images or results.

Certain imaging modes may employ light energy of varying wavelengths, and thus the ability to effectively resolve images and operate in the presence of a wide variety of wavelengths and over various wavelength ranges is particularly beneficial. In addition, many applications also require imaging over a large area while maintaining high resolution. Currently available immersion objectives do not allow imaging over a large area, also known as providing a large field size. For immersion imaging, the system objective is one of the most critical components of the design and may use light having a broad range of wavelengths. Currently available immersion objectives do not provide accurate imaging performance for light with a broad range of wavelengths. Further, with typical microscope designs and objective dimensions, it is unheard of to offer a device that provides a numerical aperture (NA) of 1.2, a field size of up to and in excess of approximately 0.250 millimeters, and that exhibits good visual performance.

The ability for an objective to operate within a standard microscope is both desirable and difficult to achieve for the detailed inspection performance required for semiconductor and biological inspections discussed above. No immersion objectives are currently known that can support broad wavelengths and exhibit large field sizes. Some dry objective designs may be highly corrected for broad band imaging at wavelengths, but they are typically incapable of high performance and having NAs above 0.95

It would therefore be beneficial to provide a system and objective for use in conjunction with standard microscopes and microscopy applications that overcome the foregoing drawbacks present in previously known dry imaging/immersion imaging systems. Further, it would be beneficial to provide an optical inspection system design having improved functionality over devices exhibiting the negative aspects described herein.

SUMMARY OF THE INVENTION

According to one aspect of the present design, there is provided an objective for imaging specimens is disclosed. The objective receives light energy from a light energy source configured to provide light energy in a wavelength range of approximately 480 to 660 nanometers, employs a Mangin mirror arrangement in conjunction with an immersion liquid to provide a numerical aperture in excess of 1.0 and a field size in excess of 0.05 millimeters, where every element in the objective has a diameter of less than approximately 40 millimeters.

These and other advantages of the present invention will become apparent to those skilled in the art from the following detailed description of the invention and the accompanying drawings.

DESCRIPTION OF THE DRAWINGS

The present invention is illustrated by way of example, and not by way of limitation, in the figures of the accompanying drawings in which.

DETAILED DESCRIPTION OF THE INVENTION

Figure 1:
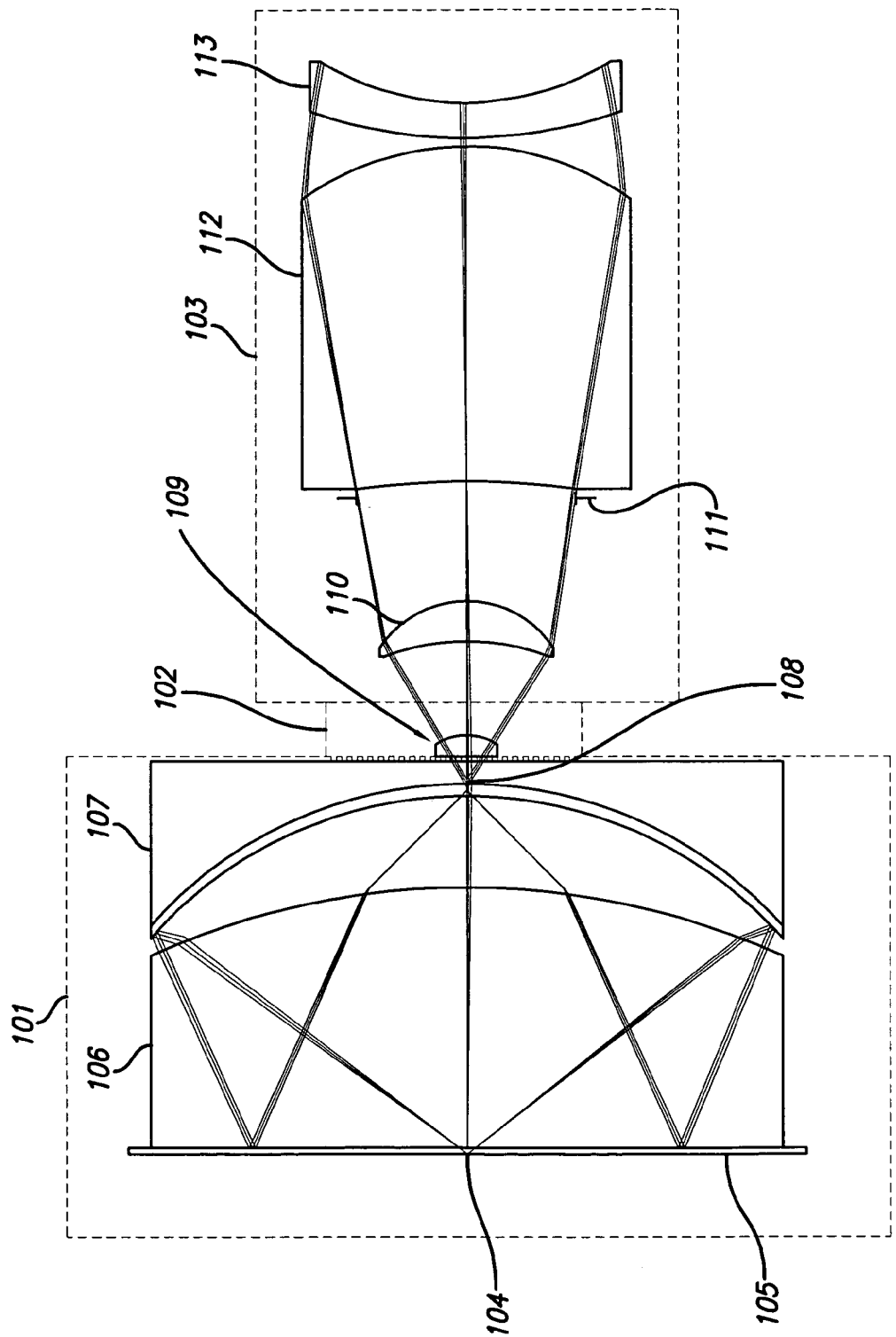
FIG. 1 presents a six element catadioptric immersion objective with a 1.2 NA in accordance with the present design, corrected over a bandwidth from 480 to 660 nm and having a field size of approximately 0.250 mm.

The present design presents a catadioptric immersion objective corrected over a wide wavelength range using two glass materials. The objective employed herein may provide particular benefits in the microscopy field. One aspect of the objective design is shown in FIG. 1. The catadioptric objective as shown in FIG. 1 is optimized for broad-band imaging in the visible spectral region, namely approximately 0.480 to 0.660 micron wavelengths. The objective uses six elements and provides high numerical apertures of 1.2 assuming a BK7 index matching fluid is used as an immersion substance. Other immersion substances could be used, including those with higher indices, to further increase the NA. The inventive design presented uses the Schupmann principle in combination with an Offner field lens to correct for axial color and first order lateral color. As shown in the aspect presented in FIG. 1, the field lens group 102 is slightly displaced from the intermediate image 108 to obtain enhanced performance, and the design employs immersion liquid and a cover glass as shown by 105.

As used herein, the terms "immersion liquid," "immersion substance," or "immersion liquid layer" refer to any non-solid non-gaseous substance, including but not limited to liquid or other viscous material, as particularly differentiated from gasses or gaseous materials. Immersion liquids that may be employed in the current design include, but are not limited to, water, oil, silicone gel, or other liquid, semi-liquid, viscous, or partially viscous substances. While solid, gaseous, or other materials may be included within the "immersion liquid" or "immersion substance," as used herein, these materials comprise primarily liquid, semi-liquid, viscous, or partially viscous substances. These terms will be used throughout this discussion primarily using the term "immersion liquid," but use of the other terms such as immersion substance or immersion liquid layer indicates materials conforming to the definition presented herein.

It should be particularly noted that the construction of objective elements as presented herein provides the beneficial performance desired. As is understood to those skilled in the art, one simply cannot take a currently available objective, employ an immersion fluid, and obtain a reasonably performing objective having the performance discussed herein. Simply because an objective can exhibit certain performance in one environment does not mean that making an alteration, such as adding an immersion substance, will enhance or even maintain that level of performance. It is the unique arrangements of elements provided herein that enable the performance discussed, such as NA, field size, and color performance, for example.

From FIG. 1, the catadioptric group 101 or Mangin mirror arrangement includes a Mangin mirror element 106. Mangin mirror element 106 is a reflectively coated lens element with the reflective portion in proximity to the immersion liquid (not shown). The catadioptric group 101 also includes a concave reflective surface on element 107 which operates as a first surface mirror when light reflects off the first surface. Both elements 106 and 107 in the catadioptric group 101 have central optical apertures in the mirror coatings where reflective material is absent. The absence of reflective material allows light to pass from the object or specimen 104 through the cover glass and immersion liquid 105 to Mangin mirror element 106, reflect from the first or inner surface of concave reflector 107, onto the reflective surface of Mangin mirror element 106, and through the aperture of concave spherical reflector 107. Element 107 acts as a lens when light passes through the central aperture in the reflective coating. An intermediate image 108 is formed in proximity to element 107. The field lens group 102 may comprise one or more lenses, and in the aspect shown in FIG. 1, one field lens 109 is employed.

The focusing lens group 103 uses multiple lens elements, in the aspect shown three lens elements 110, 112, and 113. All lenses in the focusing lens group 103 collect the light from the field lens group 102 and the intermediate image 108. The NA of the ray bundle is controlled by aperture stop 111.

Note that immersion liquid 105 is called out in FIG. 1. As this represents a liquid, it is not specifically discernable in the drawing, but the immersion liquid 105 indication is provided to suggest that the liquid is placed between the leftmost element in the Figure and the specimen (not shown). All Figures in the present application indicate the presence of the immersion liquid in a similar manner, where the liquid is indicated but not specifically discernable within a drawing.

The lens prescription for the aspect of the invention illustrated in FIG. 1 is presented in Table 1.

TABLE 1

Prescription for lenses for the design of FIG. 1

| Surf | Radius | Thickness | Glass | Diameter |
|---|---|---|---|---|
| OBJ | Infinity | 0.170 | BK7 | 0.250 |
| 1 | Infinity | 0.100 | Index matching fluid | 35.600 |

TABLE 1-continued

Prescription for lenses for the design of FIG. 1

| Surf | Radius | Thickness | Glass | Diameter |
|---|---|---|---|---|
| 2 | Infinity | 14.906 | BK7 | 0.981 |
| 3 | −42.453 | 5.216 | | 35.600 |
| 4 | −23.490 | −5.216 | MIRROR | 35.600 |
| 5 | −42.453 | −14.906 | BK7 | 35.600 |
| 6 | Infinity | 14.906 | MIRROR | 35.600 |
| 7 | −42.453 | 5.216 | | 35.600 |
| 8 | −23.490 | 2.000 | BK7 | 35.600 |
| 9 | 22.309 | 0.496 | | 1.790 |
| 10 | −40.386 | 1.000 | CAF2 | 2.768 |
| 11 | −2.998 | 5.355 | | 3.384 |
| 12 | −12.826 | 2.279 | BK7 | 9.273 |
| 13 | −5.845 | 5.901 | | 9.787 |
| STO | Infinity | 0.966 | | 12.342 |
| 15 | −44.591 | 19.111 | BK7 | 12.552 |
| 16 | −15.810 | 0.500 | | 18.532 |
| 17 | 26.768 | 2.000 | CAF2 | 17.601 |
| 18 | 15.792 | 0.000 | | 16.628 |
| IMA | Infinity | | | 0.672 |

As may be appreciated by one skilled in the art, the numbers in the leftmost column of Table 1 represent the surface number counting surfaces from the left of FIG. 1. For example, the left surface of lens 113 in the orientation presented in FIG. 1 (surface 17 in Table 1) has a radius of curvature of −26.768 mm, a thickness of 2.000 mm, and the rightmost surface (surface 18) has a radius of curvature of −15.792 mm. Regarding thickness, the thickness measurement shown represents either a thickness of a lens or a separation from the next surface depending on the particular surface being a right surface or left surface in the drawing. The material for elements 106, 107, 110, and 112 is BK7 (borosilicate, known to those skilled in the art). The material for elements 109 and 113 is calcium fluoride.

The abbreviation OBJ as used herein and commonly understood represents "Object," while the abbreviation STO represents Stop, or as commonly understood, the aperture stop for the design. IMA is understood to represent the Image plane or position.

In the design presented in FIG. 1, the numerical aperture may approach or even exceed approximately 1.2 in the BK7 index matching fluid. From FIG. 1, the focusing lens group 103 has the ability to receive light energy and transmit focused light energy. The field lens group 102 has the ability to receive the focused light energy and provide intermediate light energy, and form intermediate image 108. The catadioptric group 101 receives the intermediate energy and provides controlled light energy to the specimen 104. Alternately, the reflected path originates at the specimen 104, and light reflected from the specimen is received by the catadioptric group 101 and forms and transmits reflected light energy. The field lens group 102 receives the reflected light energy and transmitting resultant light energy, and the focusing lens group 103 receives resultant light energy and transmits focused resultant light energy. An aperture or mask can be placed at the aperture stop 111 to limit or modify the NA of the objective. The result is the ability to image a specimen using broadband light energy having a corrected bandwidth from approximately 480-660 nm at an NA of approximately 1.2 with a field size of approximately 0.25 mm and a polychromatic Strehl Ratio of better than 0.94 across the field.

The design presented in FIG. 1 and Table 1 thus uses two glass materials, BK7 and calcium fluoride. Other materials may be employed, but it is noted that other materials used within the design may require low absorption over the range of wavelengths supported by the objective design. BK7 is an ideal choice for a glass material in the visible spectrum because of its low cost. Calcium fluoride has a very wide transmission range therefore the design can be re-optimized for any center wavelength with low absorption for BK7. For example, the design can be optimized for use with lasers at 405, 488, 532, 632 nm. The design can also be optimally employed to cover lamp spectral bands within the 400 to 1000 nm range. Re-optimization requires slight tuning or altering of components, and may generally be within the abilities of those skilled in the art.

The diameter of a largest element in the FIG. 1 design is approximately 35.6 millimeters, and in general less than 40 mm, which is significantly smaller than many objective designs previously employed in this wavelength range. The small size of this objective is particularly beneficial in view of the performance characteristics of the objective. As a result, the objective can be mounted in a standard microscope turret with an approximate 60 mm flange-to-object separation. This immersion objective supports a numerical aperture of approximately 1.2, a field size of approximately 0.25 mm, has a corrected bandwidth from approximately 480-660 nm, and a polychromatic Strehl Ratio of better than 0.94 across the field, levels which had been previously unachievable in combination in a single design. Field size in this arrangement represents the size of the area on the specimen that can be imaged the system with minimum degradation in optical performance.

As is true with any optical design, certain tradeoffs may be made to improve performance characteristics depending on the desired application of the objective or optical design. It is possible, for example, to sacrifice bandwidth, field size, numerical aperture, and/or objective size to enhance one of the aforementioned performance characteristics, depending on the application. For example, optimizing for lower or higher NAs is possible. Reducing the NA can reduce the manufacturing tolerance and the outer diameter of the objective. Lower NA designs can provide larger field sizes and larger bandwidths. Lower NA designs with the same performance and less optical elements are also possible. Optimizing the design for higher NAs would generally limit the field size or bandwidth and may require slightly increased diameter objective elements. Thus it should be appreciated that the combination of performance characteristics for the present design is particularly noteworthy and has generally not been accomplished in known objective designs.

The design of FIG. 1 provides a relatively low intrinsic polychromatic wavefront aberration over the design bandwidth from approximately 480-660 nm. The low wavefront aberration provides increased manufacturing headroom, or ease of manufacture, while enabling relatively high performance of the manufactured objective. The design is also self corrected, where self corrected in this context means that the objective does not require any additional optical components to correct aberrations in order to achieve inspection design specifications. In other words, no additional components are needed to provide a generally aberration free image, or the objective provides substantially complete images without need for additional compensation. The ability to self correct can provide for simpler optical testing metrology and optical alignment to other self corrected imaging optics. Further correction of residual aberrations using additional imaging optics is also possible, where further correction can increase the optical specifications, including but not limited to bandwidth or field size.

The immersion objective design presented herein can support various modes of illumination and imaging. Modes supported can include bright field and a variety of dark field illumination and imaging modes. Other modes such as confocal, differential interference contrast, polarization contrast may also be supported using the present design.

Bright field mode is commonly used in microscope systems. The advantage of bright field illumination is the clarity of the image produced. Using bright field illumination with an objective such as that presented herein provides a relatively accurate representation of object feature size multiplied by the magnification of the optical system. The objective and optical components presented herein can be readily used with image comparison and processing algorithms for computerized object detection and classification. Bright field mode typically uses a broad band incoherent light source, but it may be possible to use laser illumination sources with slightly modified illumination system components and employing the objective design presented herein.

The confocal mode has been used for optical sectioning to resolve height differences of object features. Most imaging modes have difficulty detecting changes in the height of features. The confocal mode forms separate images of object features at each height of interest. Comparison of the images then shows the relative heights of different features. Confocal mode may be employed using the design presented herein.

Dark field mode has been used to detect features on objects. The advantage of the dark field mode is that flat specular areas scatter very little light toward the detector, resulting in a dark image. Surface features or objects protruding above the object tend to scatter light toward the detector. Thus, in inspecting objects like semiconductor wafers, dark field imaging produces an image of features, particles, or other irregularities on a dark background. The present design may be employed with dark field mode illumination. Dark field mode provides a large resultant signal upon striking small features that scatter light. This large resultant signal allows larger pixels to be employed for a given feature size, permitting faster object inspections. Fourier filtering can also be used to minimize the repeating pattern signal and enhance the defect signal to noise ratio during dark field inspection.

Many different dark field modes exist, each including a specific illumination and collection scheme. Illumination and collection schemes can be chosen such that the scattered and diffracted light collected from the object provides an acceptable signal-to-noise ratio. Certain optical systems use different dark field imaging modes including ring dark field, laser directional dark field, double dark field, and central dark ground. Each of these dark field imaging modes may be employed in the present design.

Any of the above mentioned imaging modes may be efficiently employed with the immersion imaging design of FIG. 1, albeit where slight modifications to certain components may offer improvements to certain performance parameters. In any configuration, the immersion imaging objective design presented enables inspection in any of the named imaging modes with the result of a relatively high numerical aperture, operation over a broad wavelength spectrum, with relatively high field size. The design can operate within a standard microscope turret and offers imaging performance better than that previously known.

Figure 2:
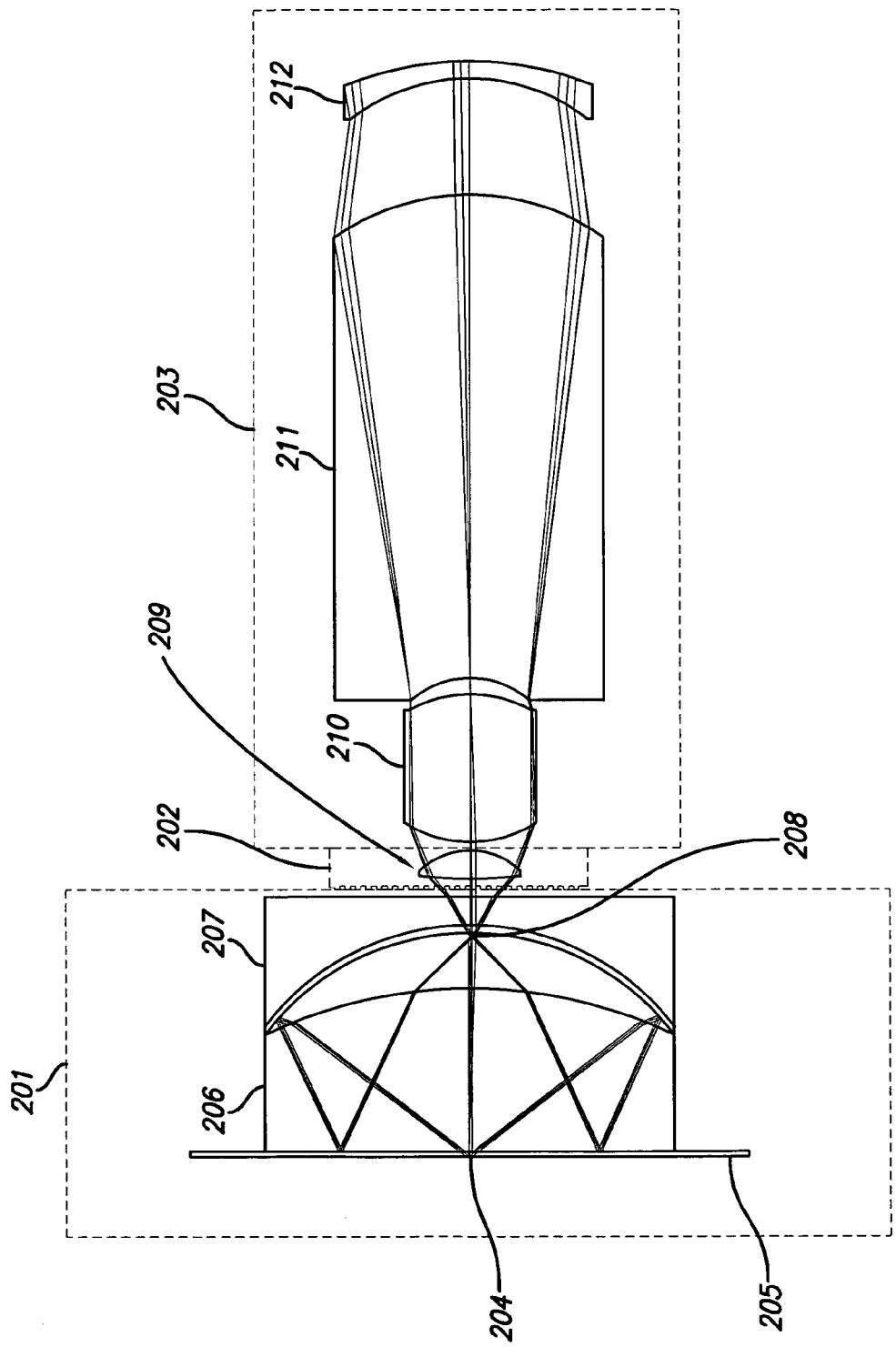
FIG. 2 presents an alternative six element catadioptric immersion objective with a 1.2 NA in accordance with the present design, corrected over a bandwidth from 480 to 660 nm and having a field size of approximately 0.250 mm.

An alternate aspect of the present design presents an immersion objective with six separate elements. This aspect of the design is presented in FIG. 2. The difference between the design of FIG. 1 and that of FIG. 2 is primarily a variation in the focusing lens group 203. This alteration allows for thicker lenses with similar performance. The use of thicker lenses can allow for simplified manufacturing and easier polishing of optical surfaces In addition, meniscus lens 212 is facing or curved toward the sample where as the design in FIG. 1, meniscus lens 112 faces away or is curved away from the sample. Meniscus lens curvature in the manner of FIG. 2 can reduce the effect of illumination light reflected from the element surfaces. Other immersion substances could be used with higher indices to further increase the NA. The objective of the design of FIG. 2 is corrected over a bandwidth from approximately 480-660 nm has a field size of approximately 0.25 mm. The worst case polychromatic Strehl ratio for the FIG. 2 design is approximately 0.96.

From FIG. 2, the catadioptric group 201 includes a Mangin mirror element 206. Mangin mirror element 206 is a reflectively coated lens element with the reflective portion in proximity to the immersion liquid. The catadioptric group 201 also includes a concave reflective surface on element 207 which operates as a first surface mirror when light reflects of the first surface. Both Mangin mirror element 206 and concave reflector 207 have central optical apertures where reflective material is absent. The absence of reflective material allows light to pass from the object or specimen 204 through the cover glass and immersion liquid 205 to Mangin mirror element 206, reflect from the first or inner surface of concave reflector 207, onto the reflective surface of Mangin mirror element 206, and through the aperture of concave spherical reflector 207. Element 207 acts as a lens when light passes through the central aperture in the reflective coating. An intermediate image 208 is formed in proximity to element 207. The field lens group 202 may comprise one or more lenses, and in the aspect shown in FIG. 2, one field lens 209 is employed.

The focusing lens group 203 employs multiple lens elements, in this aspect the three lens elements 210, 211, and 212, which may all be formed from a single type of material. The focusing lens group 203 collects light from the field lens group 202, including the intermediate image 208. An aperture or mask can be placed at the aperture stop (not shown) to limit or modify the NA of the objective. The design presented in FIG. 2 has virtually all of the advantages and flexibility described with respect to the design of FIG. 1. The lens prescription for this embodiment is shown in Table 2.

TABLE 2

Prescription for lenses for the design of FIG. 2

| Surf | Radius | Thickness | Glass | Diameter |
|---|---|---|---|---|
| OBJ | Infinity | 0.170 | BK7 | 0.250 |
| 1 | Infinity | 0.100 | Index matching fluid | 22.000 |
| 2 | Infinity | 8.883 | BK7 | 0.948 |
| 3 | −25.218 | 3.045 | | 22.000 |
| 4 | −13.764 | −3.045 | MIRROR | 22.000 |
| 5 | −25.218 | −8.883 | BK7 | 22.000 |
| 6 | Infinity | 8.883 | MIRROR | 22.000 |
| 7 | −25.218 | 3.045 | | 22.000 |
| 8 | −13.764 | 2.000 | BK7 | 22.000 |
| 9 | −15.000 | 0.973 | | 2.930 |
| 10 | 24.426 | 1.500 | CAF2 | 5.087 |
| 11 | −4.157 | 0.500 | | 5.429 |
| 12 | 6.504 | 8.063 | BK7 | 7.174 |
| 13 | −7.160 | 0.888 | | 6.731 |
| 14 | −4.789 | 26.464 | BK7 | 6.406 |
| 15 | −12.363 | 6.309 | | 14.487 |
| 16 | −10.356 | 1.000 | CAF2 | 12.818 |
| 17 | −16.677 | −34.398 | | 13.358 |
| STO | Infinity | 34.398 | | 11.711 |
| IMA | Infinity | | | 0.935 |

The material for elements 206, 207, 210, and 211 is BK7. The material for elements 209 and 212 is calcium fluoride. Other materials may be employed, but it is noted that other materials used within the design may require low absorption over the range of wavelengths supported by the objective design. BK7 is an ideal choice for a glass material in the visible spectrum because of its low cost. Calcium fluoride has a very wide transmission range therefore the design can be re-optimized for any center wavelength with low absorption for BK7. Re-optimization requires slight tuning or altering of components, and may generally be within the abilities of those skilled in the art.

The maximum diameter of an element is 22.0 millimeters, but again generally less than 30 mm and approximately 22.0 mm, which is significantly smaller than many objective designs previously employed in this wavelength range.

Figure 3:
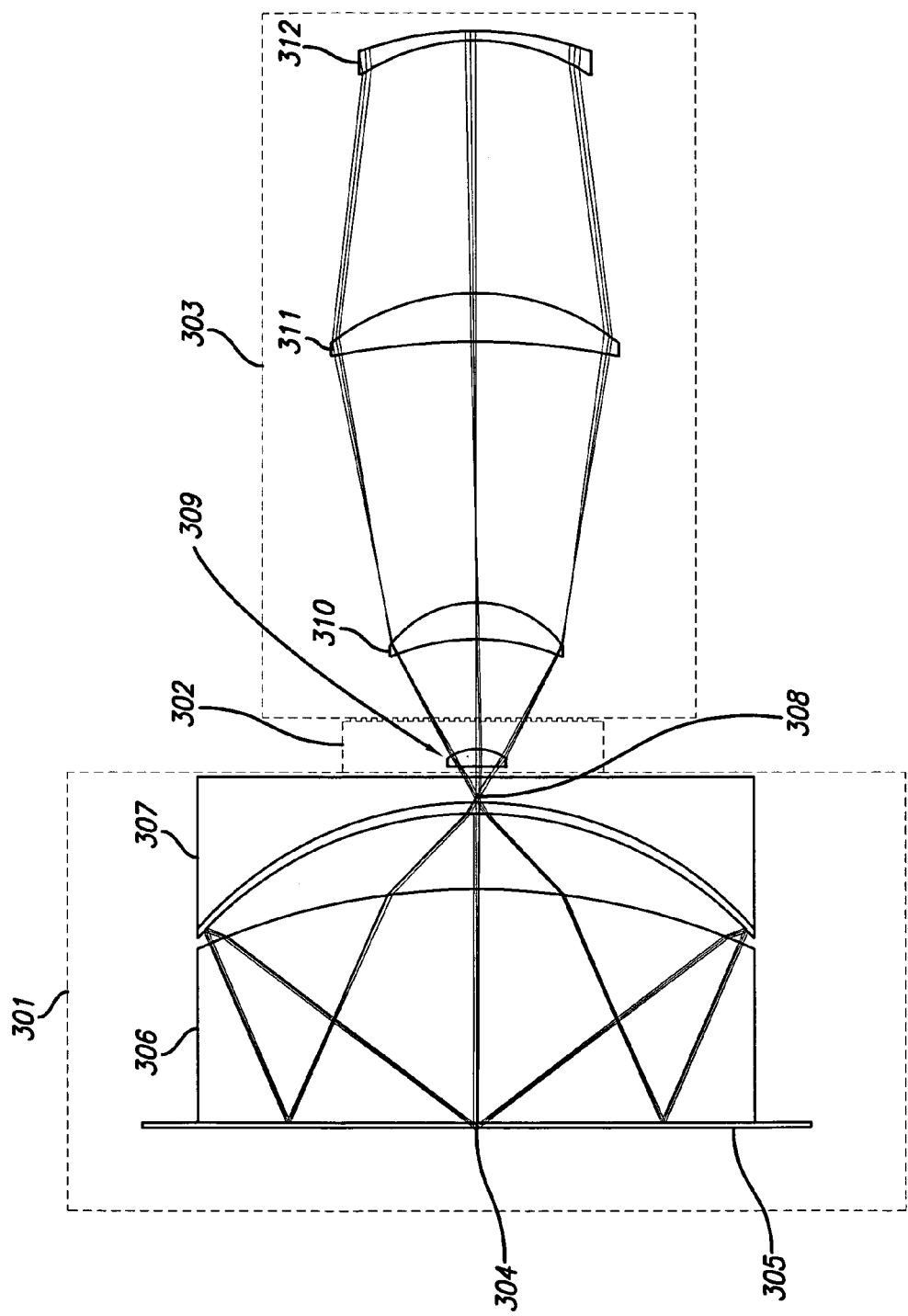
FIG. 3 presents a further six element catadioptric immersion objective with a 1.2 NA in accordance with the present design, corrected over a bandwidth from 480 to 660 nm and having a field size of approximately 0.250 mm.

An alternate aspect of the present design presents an immersion objective again having six elements. This aspect of the design is presented in FIG. 3. The main difference between the design of FIG. 3 and that of FIG. 2 is in the focusing lens group. The FIG. 3 design uses thinner lenses while allowing the meniscus lens 312 to face toward the sample. Thinner lenses can reduce the effect of illumination light reflected from individual element surfaces. This aspect of the design uses an index matching fluid for BK7, i.e. a fluid that matches the BK7 lenses and provides good optical performance. One example of a BK7 matching fluid is produced by Cargille product code number 11510, but others are available. This fluid is engineered to have a refractive index that is very similar to BK7 for wavelengths between 310 and 1100 nm. Other immersion substances could be used with higher indices to further increase the NA. The objective of the design of FIG. 3 is corrected over a bandwidth from approximately 480-660 nm has a field size of approximately 0.25 mm. The worst case polychromatic Strehl ratio for the FIG. 3 design is approximately 0.92.

From FIG. 3, the catadioptric group 301 includes a Mangin mirror element 306. The catadioptric group 301 also includes a concave reflective surface on element 307 which operates as a first surface mirror when light reflects of the first surface. Both Mangin mirror element 306 and concave reflector 307 have central optical apertures where reflective material is absent. The absence of reflective material allows light to pass from the object or specimen 304 through the cover glass and immersion liquid 305 to Mangin mirror element 306, reflect from the first or inner surface of concave reflector 307, onto the reflective surface of Mangin mirror element 306, and through the aperture of concave spherical reflector 307. Element 307 acts as a lens when light passes through the central aperture in the reflective coating. An intermediate image 308 is formed in proximity to element 307. The field lens group 302 may comprise one or more lenses, and in the aspect shown in FIG. 3, one field lens 309 is employed.

The focusing lens group 303 employs multiple lens elements, in this aspect the three lens elements 310, 311, and 312, which may all be formed from a single type of material. The focusing lens group 303 collects light from the field lens group 302, including the intermediate image 308. An aperture or mask can be placed at the aperture stop (not shown) to limit or modify the NA of the objective. The design presented in FIG. 3 has virtually all of the advantages and flexibility described with respect to the design of FIG. 1. The lens prescription for this embodiment is shown in Table 3.

TABLE 3

Prescription for lenses for the design of FIG. 3

| Surf | Radius | Thickness | Glass | Diameter |
| --- | --- | --- | --- | --- |
| OBJ | Infinity | 0.170 | BK7 | 0.250 |
| 1 | Infinity | 0.100 | Index matching fluid | 30.000 |
| 2 | Infinity | 12.812 | BK7 | 0.947 |
| 3 | −35.748 | 4.140 | | 30.000 |
| 4 | −19.798 | −4.140 | MIRROR | 30.000 |
| 5 | −35.748 | −12.812 | BK7 | 30.000 |
| 6 | Infinity | 12.812 | MIRROR | 30.000 |
| 7 | −35.748 | 4.140 | | 30.000 |
| 8 | −19.798 | 2.000 | BK7 | 30.000 |
| 9 | 30.000 | 0.501 | | 1.638 |
| 10 | 3972.345 | 1.000 | CAF2 | 2.613 |
| 11 | −2.740 | 6.039 | | 3.172 |
| 12 | −11.732 | 2.017 | BK7 | 8.922 |
| 13 | −5.805 | 14.251 | | 9.398 |
| 14 | −37.691 | 2.679 | BK7 | 15.216 |
| 15 | −12.178 | 13.791 | | 15.487 |
| 16 | −10.932 | 0.500 | CAF2 | 12.172 |
| 17 | −18.626 | −22.016 | | 12.490 |
| STO | Infinity | 22.016 | | 11.402 |
| IMA | Infinity | | | 0.947 |

The material for elements 306, 307, 309, and 311 is BK7 and the material for elements 310 and 312 is calcium fluoride. Other materials may be employed, but it is noted that other materials used within the design may require low absorption over the range of wavelengths supported by the objective design. Re-optimization requires slight tuning or altering of components, and may generally be within the abilities of those skilled in the art.

The maximum diameter of an element is approximately 30.0 millimeters, which is significantly smaller than many objective designs previously employed in this wavelength range.

Figure 4:
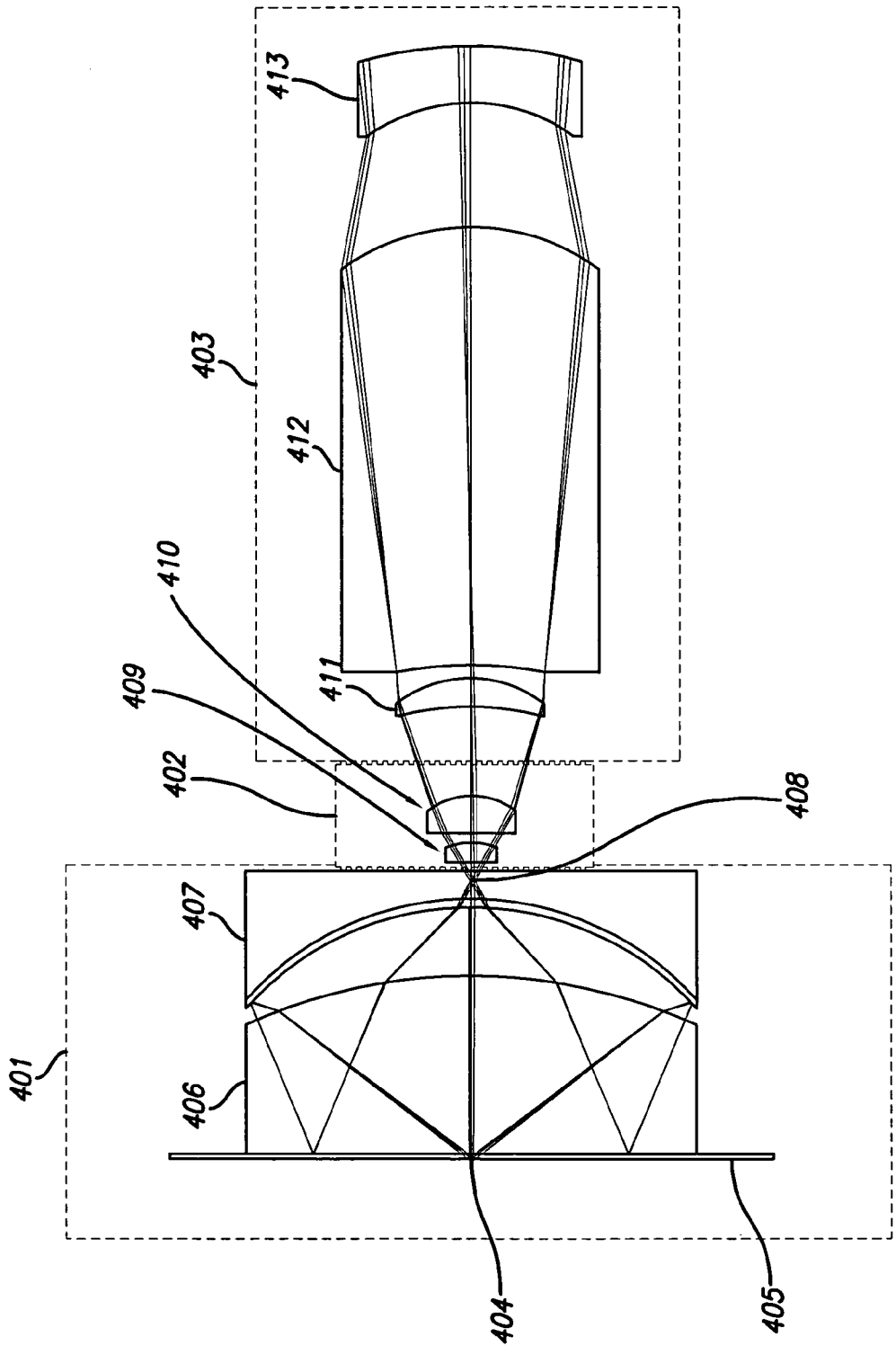
FIG. 4 presents a seven element catadioptric immersion objective with a 1.2 NA in accordance with the present design, corrected over a bandwidth from 480 to 660 nm and having a field size of approximately 0.250 mm.

Another aspect of the present design presents an immersion objective again having seven elements, shown in FIG. 4. The main difference between the design of FIG. 4 and that of FIG. 2 is an additional lens added to the field lens group, allowing for more realistic and easily manufactured curvatures on lenses in the focusing lens group. This aspect of the design again uses an index matching fluid for BK7, but other immersion substances could be used with higher indices to further increase the NA. The objective of the design of FIG. 4 is again corrected over a bandwidth from approximately 480-660 nm has a field size of approximately 0.25 mm. The worst case polychromatic Strehl ratio for the FIG. 4 design is approximately 0.93.

From FIG. 4, the catadioptric group 401 includes a Mangin mirror element 406. Mangin mirror element 406 is again a reflectively coated lens element with the reflective portion in proximity to the immersion liquid 405. The catadioptric group 401 also includes a concave reflective surface on element 407 which operates as a first surface mirror when light reflects of the first surface. Both Mangin mirror element 406 and concave reflector 407 have central optical apertures where reflective material is absent. The absence of reflective material allows light to pass from the object or specimen 404 through the cover glass and immersion liquid 405 to Mangin mirror element 406, reflect from the first or inner surface of concave reflector 407, onto the reflective surface of Mangin mirror element 406, and through the aperture of concave spherical reflector 407. Element 407 acts as a lens when light passes through the central aperture in the reflective coating. Note that element 407 has a shape wherein the inner (specimen side) reflective surface is curved while the outer surface is flat or relatively flat, and the element 407 acts as a lens in this configuration as well as a reflective device. An intermediate image 408 is formed in proximity to element 407. The field lens group 402 may comprise one or more lenses, and in the aspect shown in FIG. 4, two field lenses 409 and 410 are employed.

The focusing lens group 403 employs multiple lens elements, where the three lens elements 411, 412, and 413 may all be formed from a single type of material. The focusing lens group 403 collects light from the field lens group 402, including the intermediate image 408. An aperture or mask can be placed at the aperture stop (not shown) to limit or modify the NA of the objective. The design presented in FIG. 4 has virtually all of the advantages and flexibility described with respect to the design of FIG. 1. The lens prescription for this embodiment is shown in Table 4.

TABLE 4

Prescription for lenses for the design of FIG. 4

| Surf | Radius | Thickness | Glass | Diameter |
|---|---|---|---|---|
| OBJ | Infinity | 0.170 | BK7 | 0.250 |
| 1 | Infinity | 0.100 | Index matching fluid | 24.000 |
| 2 | Infinity | 9.589 | BK7 | 0.947 |
| 3 | −28.972 | 3.719 | | 24.000 |
| 4 | −15.901 | −3.719 | MIRROR | 24.000 |
| 5 | −28.972 | −9.589 | BK7 | 24.000 |
| 6 | Infinity | 9.589 | MIRROR | 24.000 |
| 7 | −28.972 | 3.719 | | 24.000 |
| 8 | −15.901 | 2.000 | BK7 | 24.000 |
| 9 | 30.000 | 0.500 | | 0.889 |
| 10 | −9.349 | 1.000 | BK7 | 1.736 |
| 11 | −4.017 | 0.500 | | 2.644 |
| 12 | 102.437 | 2.041 | CAF2 | 3.650 |
| 13 | −3.738 | 4.814 | | 4.663 |
| 14 | −14.660 | 1.518 | BK7 | 7.523 |
| 15 | −6.218 | 0.698 | | 7.857 |
| 16 | −20.499 | 23.616 | BK7 | 7.940 |
| 17 | −11.600 | 6.735 | | 13.765 |
| 18 | −9.359 | 3.000 | CAF2 | 11.134 |
| 19 | −22.046 | −23.061 | | 11.970 |
| STO | Infinity | 23.061 | | 10.742 |
| IMA | Infinity | | | 1.013 |

The material for elements 406, 407, 409, 410, and 412 is BK7. The material for elements 411 and 413 is calcium fluoride. Other materials may be employed, but it is noted that other materials used within the design may require low absorption over the range of wavelengths supported by the objective design. BK7 is an ideal choice for a glass material in the visible spectrum because of its low cost. Calcium fluoride has a very wide transmission range, and as a result the design and lens prescriptions can be altered (re-optimized) for any center wavelength with low absorption for BK7. Re-optimization requires slight tuning or altering of components, and may generally be within the abilities of those skilled in the art.

The maximum diameter of an element in the FIG. 4 design is approximately 24.0 millimeters, and in all cases less than 30 millimeters, which is significantly smaller than many objective designs previously employed in this wavelength range.

Figure 5:
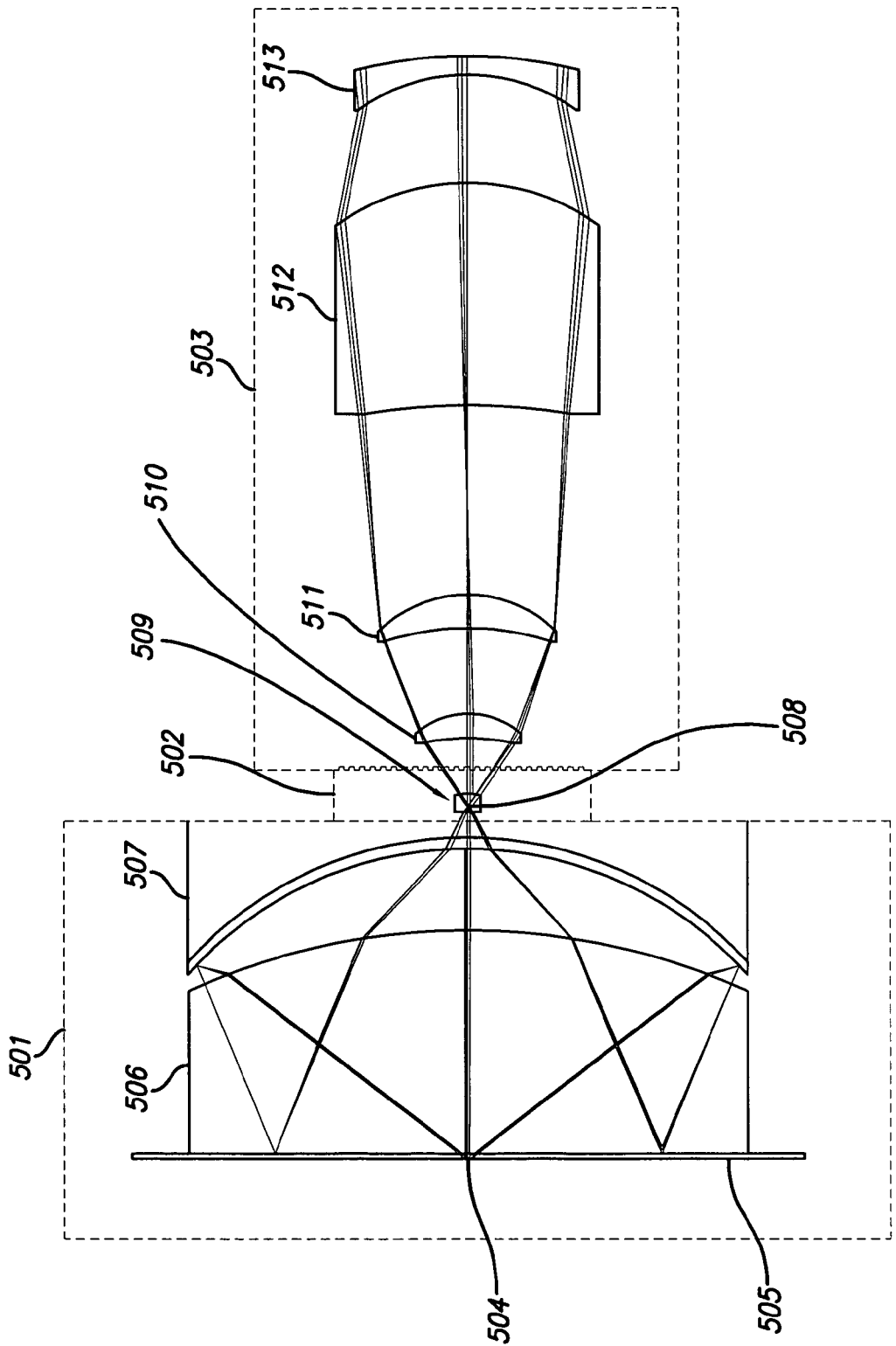
FIG. 5 presents an alternative seven element catadioptric immersion objective with a 1.2 NA in accordance with the present design, corrected over a bandwidth from 480 to 660 nm and having a field size of approximately 0.250 mm.

Another aspect of the present design presents an immersion objective again having seven elements as shown in FIG. 5. The main difference between the design of FIG. 5 and that of FIG. 4 is an increase in the lens spacing between lenses 509 and 510. This spacing makes lens 510 function more as part of the focusing lens group and perform a focusing function. This shift allows decrease in the thickness of lens 512 compared to similar lens 412 from FIG. 4, resulting in an objective design (specifically lens 512) that is easier to mount and manufacture than lens 412. In addition, intermediate image 508 moves outside element 507 to reduce problems associated with glass homogeneity.

The design of FIG. 5 again uses an index matching fluid for BK7 as immersion liquid 505. Other immersion substances may be used with higher indexes to further increase the NA. The objective of the design of FIG. 5 is corrected over a bandwidth from approximately 480-660 nm has a field size of approximately 0.25 mm, and the worst case polychromatic Strehl ratio for the FIG. 5 design is approximately 0.91.

From FIG. 5, the catadioptric group 501 includes a Mangin mirror element 506. Mangin mirror element 506 is a reflectively coated lens element with the reflective portion in proximity to the immersion liquid. The catadioptric group 501 also includes a concave reflective surface on element 507 which operates as a first surface mirror when light reflects of the first surface. Both Mangin mirror element 506 and concave reflector 507 have central optical apertures where reflective material is absent. The absence of reflective material allows light to pass from the object or specimen 504 through the cover glass and immersion liquid 505 to Mangin mirror element 506, reflect from the first or inner surface of concave reflector 507, onto the reflective surface of Mangin mirror element 506, and through the aperture of concave spherical reflector 507. Element 507 acts as a lens when light passes through the central aperture in the reflective coating. An intermediate image 508 is formed in proximity to element 507. The field lens group 502 may comprise one or more lenses, and in the aspect shown in FIG. 5, one field lens 509 is employed.

The focusing lens group 503 employs multiple lens elements, in this aspect the four lens elements 510, 511, 512, and 513, which may all be formed from a single type of material. The focusing lens group 503 collects light from the field lens group 502, including the intermediate image 508. An aperture or mask can be placed at the aperture stop (not shown) to limit or modify the NA of the objective. The design presented in FIG. 5 has virtually all of the advantages and flexibility described with respect to the design of FIG. 1. The lens prescription for this embodiment is shown in Table 5.

TABLE 5

Prescription for lenses for the design of FIG. 5

| Surf | Radius | Thickness | Glass | Diameter |
|---|---|---|---|---|
| OBJ | Infinity | 0.170 | BK7 | 0.250 |
| 1 | Infinity | 0.100 | Index matching fluid | 30.000 |
| 2 | Infinity | 12.174 | BK7 | 0.948 |
| 3 | −35.790 | 4.427 | | 30.000 |
| 4 | −19.856 | −4.427 | MIRROR | 30.000 |
| 5 | −35.790 | −12.174 | BK7 | 30.000 |
| 6 | Infinity | 12.174 | MIRROR | 30.000 |
| 7 | −35.790 | 4.427 | | 30.000 |
| 8 | −19.856 | 1.500 | BK7 | 30.000 |
| 9 | −14.247 | 0.500 | | 1.340 |
| 10 | −2.845 | 1.000 | BK7 | 0.466 |
| 11 | −2.364 | 2.998 | | 1.423 |
| 12 | −12.316 | 1.368 | CAF2 | 5.179 |
| 13 | −4.103 | 4.646 | | 5.686 |
| 14 | −14.980 | 1.812 | BK7 | 9.206 |
| 15 | −6.611 | 10.319 | | 9.545 |
| 16 | −32.287 | 12.078 | BK7 | 11.513 |
| 17 | −11.899 | 5.908 | | 14.142 |
| 18 | −9.663 | 1.000 | CAF2 | 11.592 |
| 19 | −23.891 | −20.866 | | 12.013 |
| STO | Infinity | 20.866 | | 10.918 |
| IMA | Infinity | | | 0.993 |

Elements 506, 507, 509, 510, and 512 are formed of BK7, while elements 511 and 513 are formed from calcium fluoride.

The design presented in FIG. 5 and Table 5 thus uses two glass materials, BK7 and calcium fluoride. Other materials may be employed, but it is noted that other materials used within the design may require low absorption over the range of wavelengths supported by the objective design. BK7 is an ideal choice for a glass material in the visible spectrum because of its low cost. Calcium fluoride has a very wide transmission range therefore the design can be re-optimized for any center wavelength with low absorption for BK7. Re-optimization requires slight tuning or altering of components, and may generally be within the abilities of those skilled in the art.

The maximum diameter of an element is approximately 30.0 millimeters, but in all cases less than 40.0 millimeters, which is significantly smaller than many objective designs previously employed in this wavelength range.

Figure 6:
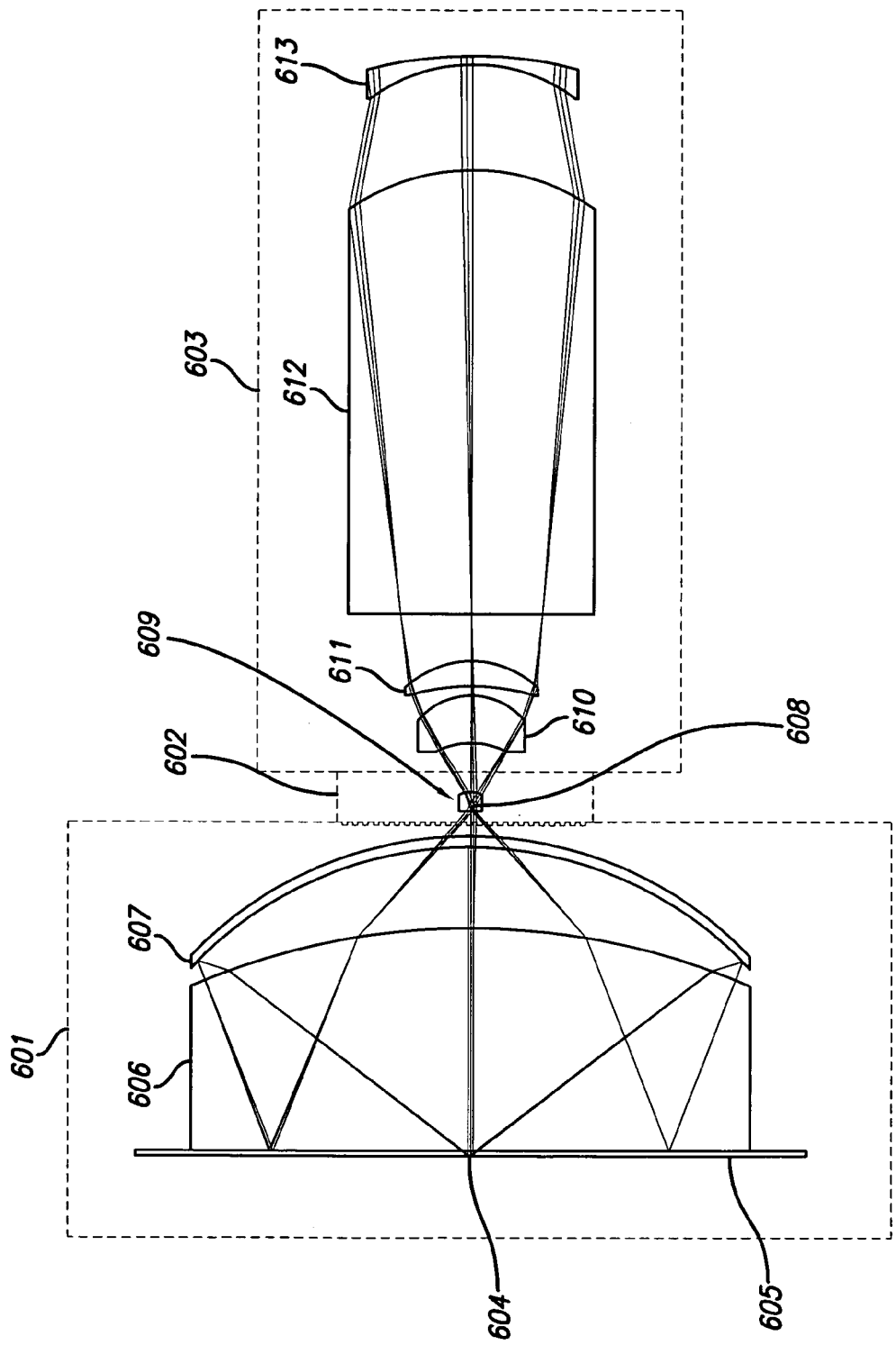
FIG. 6 presents a further seven element catadioptric immersion objective with a 1.2 NA in accordance with the present design, corrected over a bandwidth from 480 to 660 nm and having a field size of approximately 0.250 mm.

Still another aspect of the present design presents an immersion objective again having seven elements. This aspect of the design is presented in FIG. 6. The main difference between the design of FIG. 6 and that of FIG. 5 is a change in the lensing arrangement of the focusing lens group. In this arrangement, lens element 612 has increased thickness, similar to element 412 shown in FIG. 4. This aspect of the design again uses an index matching fluid for BK7. Other immersion substances could be used with higher indices to further increase the NA. The objective of the design of FIG. 6 is corrected over a bandwidth from approximately 480-660 nm and has a field size of approximately 0.25 mm. The worst case polychromatic Strehl ratio for the FIG. 6 design is approximately 0.94.

From FIG. 6, the catadioptric group 601 includes a Mangin mirror element 606. Mangin mirror element 606 is a reflectively coated lens element with the reflective portion in proximity to the immersion liquid. The catadioptric group 601 also includes a concave reflective surface on element 607 which operates as a first surface mirror when light reflects of the first surface. Both Mangin mirror element 606 and concave reflector 607 have central optical apertures where reflective material is absent. The absence of reflective material allows light to pass from the object or specimen 604 through the cover glass and immersion liquid 605 to Mangin mirror element 606, reflect from the first or inner surface of concave reflector 607, onto the reflective surface of Mangin mirror element 606, and through the aperture of concave spherical reflector 607. Element 607 acts as a lens when light passes through the central aperture in the reflective coating. An intermediate image 608 is formed in proximity to element 607. The field lens group 602 may comprise one or more lenses, and in the aspect shown in FIG. 6, one field lens 609 is employed.

The focusing lens group 603 employs multiple lens elements, in this aspect the four lens elements 610, 611, 612, and 613, which may all be formed from a single type of material. The focusing lens group 603 collects light from the field lens group 602, including the intermediate image 608. An aperture or mask can be placed at the aperture stop (not shown) to limit or modify the NA of the objective. The design presented in FIG. 6 has virtually all of the advantages and flexibility described with respect to the design of FIG. 1. The lens prescription for this embodiment is shown in Table 6.

TABLE 6

Prescription for lenses for the design of FIG. 6

| Surf | Radius | Thickness | Glass |
|---|---|---|---|
| OBJ | Infinity | 0.170 | BK7 |
| 1 | Infinity | 0.100 | 1.515000, 44.000000 |
| 2 | Infinity | 12.216 | BK7 |
| 3 | −36.223 | 4.359 | |
| 4 | −20.167 | −4.359 | MIRROR |
| 5 | −36.223 | −12.216 | BK7 |
| 6 | Infinity | 12.216 | MIRROR |
| 7 | −36.223 | 4.359 | |
| 8 | Infinity | 2.000 | |
| 9 | −2.165 | 1.000 | BK7 |
| 10 | −1.563 | 2.672 | |
| 11 | −4.181 | 2.586 | CAF2 |
| 12 | −3.668 | 0.500 | |
| 13 | −12.620 | 1.374 | BK7 |
| 14 | −5.385 | 2.699 | |
| 15 | −51.384 | 24.097 | BK7 |
| 16 | −11.407 | 5.727 | |
| 17 | −9.190 | 0.500 | CAF2 |
| 18 | −21.150 | −20.507 | |
| STO | Infinity | 20.507 | |

The material for elements 606, 607, 609, 611, and 612 is BK7. The material for elements 610 and 613 is calcium fluoride. The design presented in FIG. 6 and Table 6 thus uses two glass materials, BK7 and calcium fluoride. Other materials may be employed, but it is noted that other materials used within the design may require low absorption over the range of wavelengths supported by the objective design. BK7 is an ideal choice for a glass material in the visible spectrum because of its low cost. Calcium fluoride has a very wide transmission range therefore the design can be re-optimized for any center wavelength with low absorption for BK7. Re-optimization requires slight tuning or altering of lenses/components, and may generally be within the abilities of those skilled in the art.

The maximum diameter of an element is approximately 30.0 millimeters, but in all cases less than 40 millimeters, which is significantly smaller than many objective designs previously employed in this wavelength range.

Figure 7:
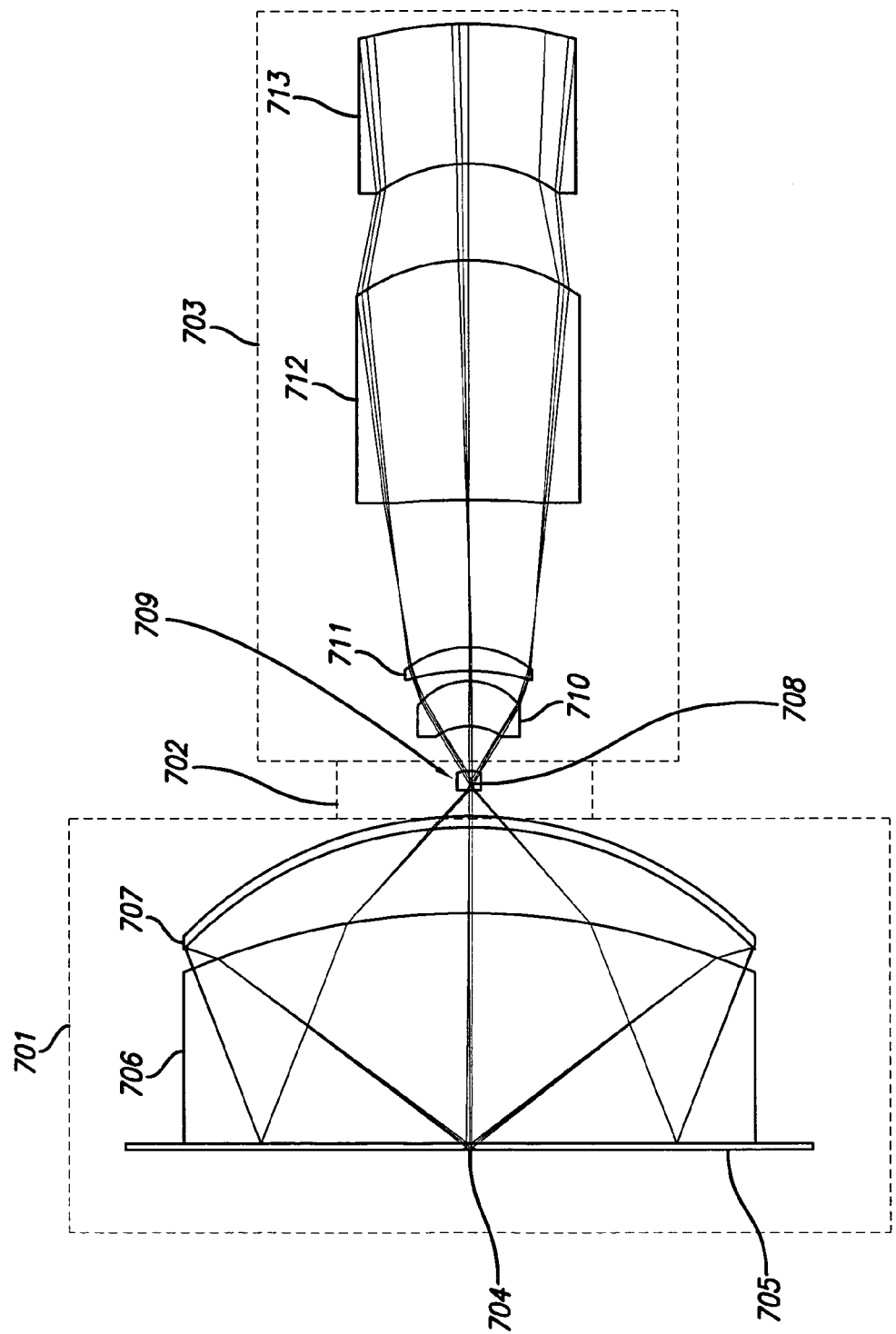
FIG. 7 presents an additional seven element catadioptric immersion objective with a 1.2 NA in accordance with the present design, corrected over a bandwidth from 480 to 660 nm and having a field size of approximately 0.250 mm.

An alternate aspect of the present design presents an immersion objective again having seven elements. This aspect of the design is presented in FIG. 7. The main difference between the design of FIG. 7 previously presented designs is changing element 707 from a mirror-lens element to a pure first surface mirror, without the lens aspect shown in the previous designs. The design of FIG. 7 also has an increased thickness for lens 713, making lens 713 easier to manufacture. In addition the intermediate image 708 and field lens 709 have been moved further away from element 707 to enable easier mounting of lens 709 in the objective as well as the finite thickness of mirror element 707. This aspect of the design again uses an index matching fluid for BK7. Other immersion substances could be used with higher indices to further increase the NA. The objective of the design of FIG. 7 is corrected over a bandwidth from approximately 480-660 nm has a field size of approximately 0.25 mm. The worst case polychromatic Strehl ratio for the FIG. 7 design is approximately 0.92.

From FIG. 7, the catadioptric group 701 includes a Mangin mirror element 706. Mangin mirror element 706 is a reflectively coated lens element with the reflective portion in proximity to the immersion liquid 705. The catadioptric group 701 also includes a concave reflective surface on element 707 which operates as a first surface mirror when light reflects off the first surface. Mangin mirror element 706 has a central concave optical aperture where reflective material is absent.

The absence of reflective material allows light to pass from the object or specimen 704 through any cover glass and immersion liquid 705 to Mangin mirror element 706, reflect from concave reflector 707, onto the reflective surface of Mangin mirror element 706, and through a hole in the center of concave spherical reflector 707. An intermediate image 708 is formed in proximity to element 707 and field lens group 702. The field lens group 702 may comprise one or more lenses, and in the aspect shown in FIG. 7, one field lens 709 is employed.

The focusing lens group 703 employs multiple lens elements, in this aspect the four lens elements 710, 711, 712, and 713, which may all be formed from a single type of material. The focusing lens group 703 collects light from the field lens group 702, including the intermediate image 708. An aperture or mask can be placed at the aperture stop (not shown) to limit or modify the NA of the objective. The design presented in FIG. 7 has virtually all of the advantages, flexibility and performance characteristics described with respect to the design of FIG. 1. The lens prescription for this embodiment is shown in Table 7.

TABLE 7

Prescription for lenses for the design of FIG. 7

| Surf | Radius | Thickness | Glass | Diameter |
|---|---|---|---|---|
| OBJ | Infinity | 0.170 | BK7 | 0.250 |
| 1 | Infinity | 0.100 | Index matching fluid | 30.000 |
| 2 | Infinity | 12.321 | BK7 | 0.948 |
| 3 | −37.030 | 4.573 | | 30.000 |
| 4 | −20.572 | −4.573 | MIRROR | 30.000 |
| 5 | −37.030 | −12.321 | BK7 | 30.000 |
| 6 | Infinity | 12.321 | MIRROR | 30.000 |
| 7 | −37.030 | 4.573 | | 30.000 |
| 8 | Infinity | 2.000 | | 4.098 |
| 9 | −2.139 | 1.000 | BK7 | 0.650 |
| 10 | −1.441 | 2.362 | | 1.210 |
| 11 | −3.145 | 2.474 | BK7 | 3.450 |
| 12 | −3.395 | 0.500 | | 5.411 |
| 13 | −11.213 | 1.276 | BK7 | 6.323 |
| 14 | −5.092 | 7.811 | | 6.640 |
| 15 | −71.044 | 12.810 | BK7 | 8.910 |
| 16 | −10.055 | 5.156 | | 11.765 |
| 17 | −8.077 | 7.447 | CAF2 | 9.718 |
| 18 | −21.280 | −26.812 | | 11.469 |
| STO | Infinity | 26.812 | | 9.865 |
| IMA | Infinity | | | 1.114 |

The material for elements 706, 707, 709, 710, 711, and 712 is BK7. The material for element 713 is calcium fluoride. Other materials may be employed, but it is noted that other materials used within the design may require low absorption over the range of wavelengths supported by the objective design. BK7 is an ideal choice for a glass material in the visible spectrum because of its low cost. Calcium fluoride has a very wide transmission range therefore the design can be re-optimized for any center wavelength with low absorption for BK7. Re-optimization requires slight tuning or altering of components, and may generally be within the abilities of those skilled in the art.

The maximum diameter of an element for a design similar to that of FIG. 7 is approximately 30.0 millimeters, and generally less than approximately 40 millimeters, again significantly smaller than many objective designs previously employed in this wavelength range.

Figure 8:
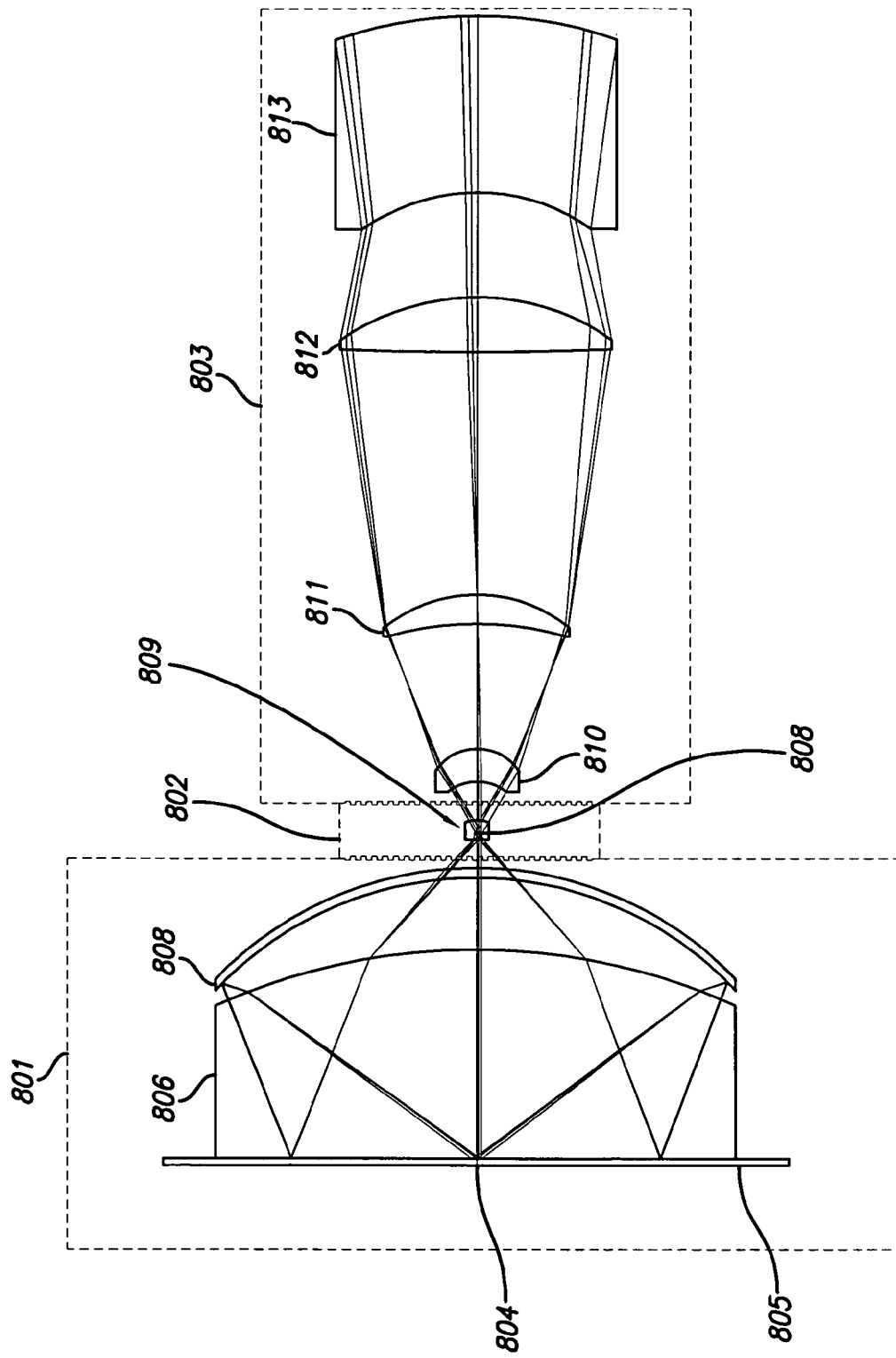
FIG. 8 presents an alternate seven element catadioptric immersion objective with a 1.2 NA in accordance with the present design, corrected over a bandwidth from 480 to 660 nm and having a field size of approximately 0.250 mm.

An alternate aspect of the present design presents a different seven element immersion objective and is shown in FIG. 8. The design of FIG. 8 has a decreased thickness for lens 812 compared to similar lens 712 in FIG. 7, making lens 812 easier to manufacture. This design also uses an index matching fluid for BK7. Other immersion substances could be used with higher indexes to further increase the NA. The objective of FIG. 8 is corrected over a bandwidth from approximately 480-660 nm, and has a field size of approximately 0.25 mm. The worst case polychromatic Strehl ratio for the FIG. 8 design is approximately 0.92.

From FIG. 8, the catadioptric group 801 includes a Mangin mirror element 806. Mangin mirror element 806 is a reflectively coated lens element with the reflective portion in proximity to the immersion liquid. The catadioptric group 801 also includes a concave reflective surface on element 807 which operates as a first surface mirror when light reflects of the first surface. Mangin mirror element 806 again has a central concave optical aperture where reflective material is absent. The absence of reflective material allows light to pass from the object or specimen 804 through the cover glass and immersion liquid 805 to Mangin mirror element 806, reflect from concave reflector 807, onto the reflective surface of Mangin mirror element 806, and through a hole in the center of concave spherical reflector 807. An intermediate image 808 is formed in proximity to element 807 and field lens group 802. The field lens group 802 may comprise one or more lenses, and in the aspect shown in FIG. 8, one field lens 809 is employed.

The focusing lens group 803 employs multiple lens elements, in this aspect the four lens elements 810, 811, 812, and 813, which may all be formed from a single type of material. The focusing lens group 803 collects light from the field lens group 802, including the intermediate image 808. An aperture or mask can be placed at the aperture stop (not shown) to limit or modify the NA of the objective. The design presented in FIG. 8 has virtually all of the advantages, flexibility, and performance described with respect to the design of FIG. 1. The lens prescription for this embodiment is shown in Table 8.

TABLE 8

Prescription for lenses for the design of FIG. 8

| Surf | Radius | Thickness | Glass | Diameter |
|---|---|---|---|---|
| OBJ | Infinity | 0.170 | BK7 | 0.250 |
| 1 | Infinity | 0.100 | Index matching fluid | 26.600 |
| 2 | Infinity | 10.884 | BK7 | 0.947 |
| 3 | −32.252 | 3.796 | | 26.600 |
| 4 | −17.950 | −3.796 | MIRROR | 26.600 |
| 5 | −32.252 | −10.884 | BK7 | 26.600 |
| 6 | Infinity | 10.884 | MIRROR | 26.600 |
| 7 | −32.252 | 3.796 | | 26.600 |
| 8 | Infinity | 2.000 | | 4.029 |
| 9 | −2.321 | 1.000 | BK7 | 0.654 |
| 10 | −1.444 | 2.022 | | 1.189 |
| 11 | −2.355 | 1.725 | BK7 | 2.986 |
| 12 | −2.571 | 6.438 | | 4.345 |
| 13 | −18.575 | 1.601 | BK7 | 9.175 |
| 14 | −7.607 | 12.669 | | 9.528 |
| 15 | 202.278 | 2.863 | CAF2 | 13.868 |
| 16 | −11.978 | 5.526 | | 13.961 |
| 17 | −9.760 | 9.204 | BK7 | 11.728 |
| 18 | −21.325 | −36.269 | | 14.444 |
| STO | Infinity | 36.269 | | 12.776 |
| IMA | Infinity | | | 0.858 |

The material used for elements 806, 807, 809, 810, 811, and 813 is BK7, and the material for elements 812 is calcium fluoride. Other materials may be employed, but it is noted that other materials used within the design may require low absorption over the range of wavelengths supported by the objective design. BK7 is again an ideal choice for a glass material in the visible spectrum because of its low cost. Calcium fluoride has a very wide transmission range therefore the design can be re-optimized for any center wavelength with low absorption for BK7. Re-optimization requires slight tuning or altering of components, and may generally be within the abilities of those skilled in the art.

The maximum diameter of an element in the design of FIG. 8 is approximately 26.6 millimeters, and in all cases is less than 40 millimeters, which is significantly smaller than many objective designs previously employed in this wavelength range.

Figure 9:
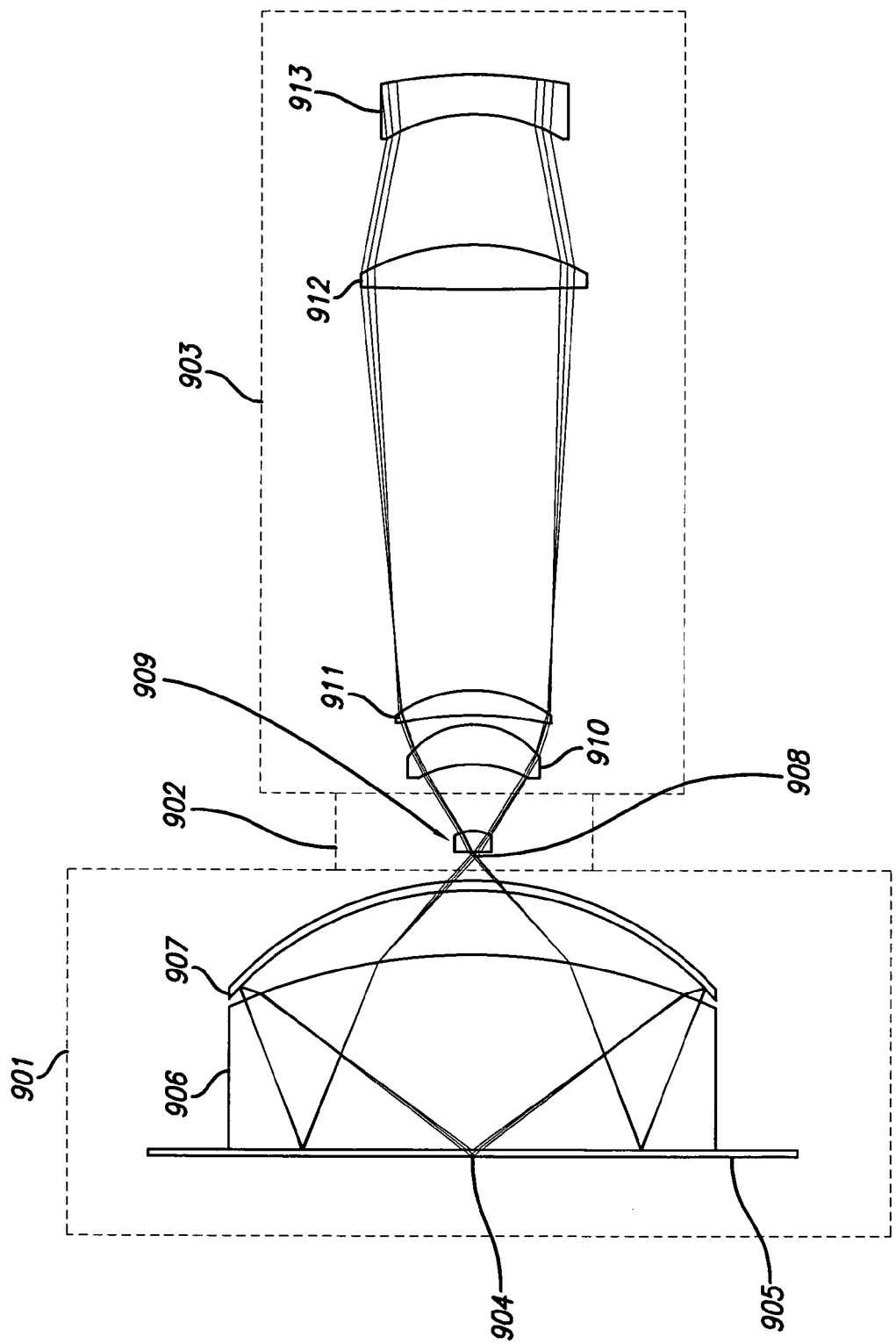
FIG. 9 presents a seven element catadioptric immersion objective with a 1.2 NA in accordance with the present design, corrected over a bandwidth from 480 to 660 nm and having a field size of approximately 0.250 mm.

An additional seven element version of the present design is shown in FIG. 9. The main difference between the design of FIG. 9 and the previous designs is the lensing arrangement of focusing lens group 903. An index matching fluid for BK7 is used, but other immersion substances could be used with higher indices to further increase the NA. The objective of the design of FIG. 9 is again corrected over a bandwidth from approximately 480-660 nm has a field size of approximately 0.25 mm. This design is fully self corrected for chromatic aberrations except for lateral color, allowing an extra degree of freedom to improve the monochromatic performance at the edge of the field. The worst case polychromatic Strehl ratio for the FIG. 9 design at 532 m is approximately 0.98. It is then possible to correct the lateral color in the following optical components such as a tube lens.

From FIG. 9, the catadioptric group 901 includes a Mangin mirror element 906. Mangin mirror element 906 is a reflectively coated lens element with the reflective portion in proximity to the immersion liquid. The catadioptric group 901 also includes a concave reflective surface on element 907 which operates as a first surface mirror when light reflects of the first surface. Mangin mirror element 906 has a central concave optical aperture where reflective material is absent. The absence of reflective material allows light to pass from the object or specimen 904 through the cover glass and immersion liquid 905 to Mangin mirror element 906, reflect from concave reflector 907, onto the reflective surface of Mangin mirror element 906, and through a hole in the center of concave spherical reflector 907. An intermediate image 908 is formed in proximity to element 907 and field lens group 902. The field lens group 902 may comprise one or more lenses, and in the aspect shown in FIG. 9, one field lens 909 is employed.

The focusing lens group 903 employs multiple lens elements, in this aspect the four lens elements 910, 911, 912, and 913, which may all be formed from a single type of material. The focusing lens group 903 collects light from the field lens group 902, including the intermediate image 908. An aperture or mask can be placed at the aperture stop (not shown) to limit or modify the NA of the objective. The design presented in FIG. 9 has virtually all of the advantages, flexibility and performance described with respect to the design of FIG. 1. The lens prescription for this embodiment is shown in Table 9.

TABLE 9

Prescription for lenses for the design of FIG. 9

| Surf | Radius | Thickness | Glass | Diameter |
|---|---|---|---|---|
| OBJ | Infinity | 0.170 | BK7 | 0.250 |
| 1 | Infinity | 0.100 | Index matching fluid | 24.000 |
| 2 | Infinity | 9.857 | BK7 | 0.947 |
| 3 | −28.587 | 3.238 | | 24.000 |
| 4 | −15.922 | −3.238 | MIRROR | 24.000 |
| 5 | −28.587 | −9.857 | BK7 | 24.000 |
| 6 | Infinity | 9.857 | MIRROR | 24.000 |

TABLE 9-continued

Prescription for lenses for the design of FIG. 9

| Surf | Radius | Thickness | Glass | Diameter |
|---|---|---|---|---|
| 7 | −28.587 | 3.238 | | 24.000 |
| 8 | Infinity | 2.000 | | 3.366 |
| 9 | −2.518 | 1.000 | BK7 | 0.907 |
| 10 | −1.824 | 3.322 | | 1.840 |
| 11 | −5.839 | 2.000 | BK7 | 5.311 |
| 12 | −4.115 | 0.500 | | 6.495 |
| 13 | −18.009 | 1.250 | BK7 | 7.489 |
| 14 | −6.134 | 20.154 | | 7.650 |
| 15 | 173.483 | 2.250 | CAF2 | 11.091 |
| 16 | −11.082 | 6.570 | | 11.163 |
| 17 | −8.067 | 2.000 | BK7 | 8.638 |
| 18 | −21.520 | −19.925 | | 9.187 |
| STO | Infinity | 19.925 | | 7.717 |
| IMA | Infinity | | | 1.433 |

Once again, the material for elements 906, 907, 909, 910, 911 and 913 is BK7, while the material for element 912 is calcium fluoride. Other materials may be employed, but other materials used within the design may require low absorption over the range of wavelengths supported by the objective design. BK7 is an ideal choice for a glass material in this application. Calcium fluoride has a very wide transmission range therefore the design can be re-optimized for any center wavelength with low absorption for BK7. Re-optimization requires slight tuning or altering of components, and may generally be within the abilities of those skilled in the art.

The maximum diameter of an element is 24.0 millimeters, which is significantly smaller than many objective designs previously employed in this wavelength range.

Thus in general, the present design comprises lenses and elements having a maximum diameter of approximately 40 millimeters but as low as 20-25 millimeters, provides numerical apertures in excess of 1.0 and approximately 1.2 in most cases, and provides a field size of approximately 0.25 millimeters, in some cases in excess of 0.20 millimeters, but in all cases in excess of 0.05 millimeters. Corrected bandwidth for the objective is approximately 480-660 nm. The objective provides a relative bandwidth in excess of 0.2 in the presence of transmitted light energy, where relative bandwidth is the ratio of the bandwidth being considered to the input or received bandwidth, sometimes referred to as reference bandwidth.

Figure 10:
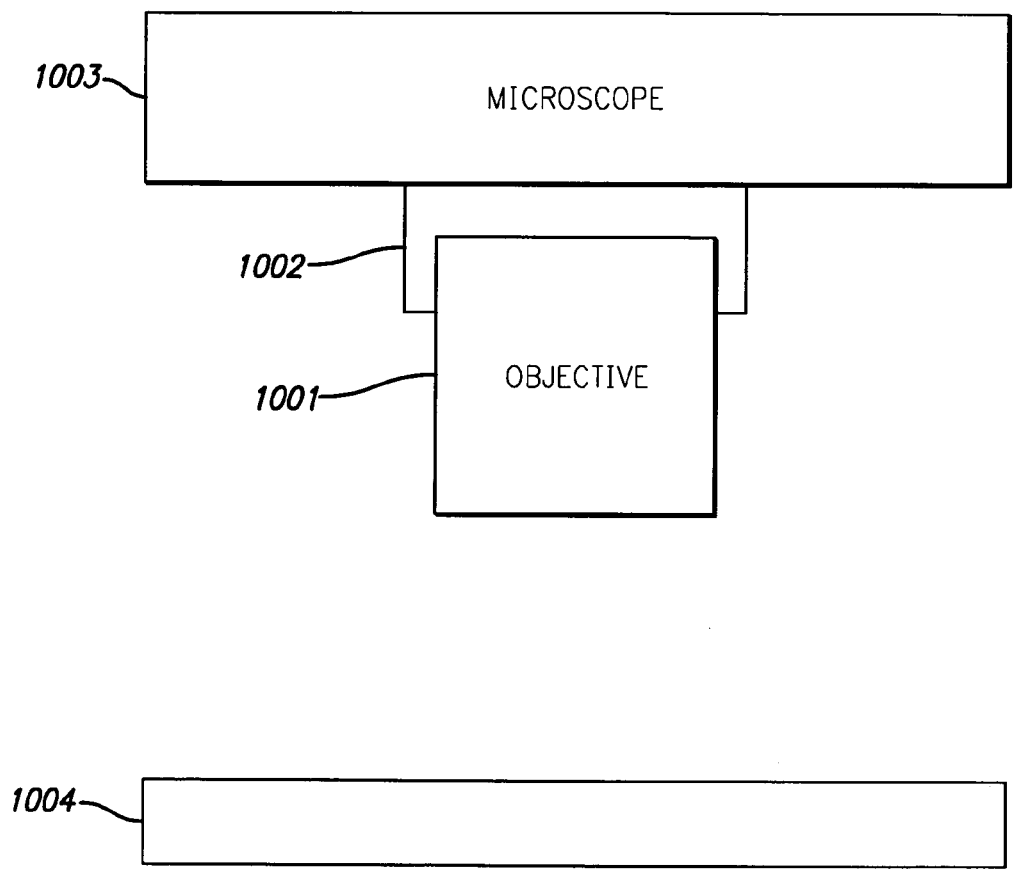
FIG. 10 shows a conceptual view of an objective used in a microscope design.

A conceptual drawing (not to scale) of an objective 1001, a flange 1002, and a microscope 1003 is illustrated in FIG. 10. Objective 1001 may take the form of the objective design disclosed herein. In normal circumstances, the flange may be located approximately 60 millimeters from the specimen. Microscope systems that employ immersion imaging are typically of the inverted type. In this type of microscope, the order of the major parts is typically reversed. In this case, the microscope 1003 would be on the bottom, with the flange 1002 holding the objective above the microscope. The sample 1004 is then be placed over the objective for viewing. This arrangement simplifies placing the immersion liquid between the objective 1001 and sample 1004.

The design presented herein and the specific aspects illustrated are meant not to be limiting, but may include alternate components while still incorporating the teachings and benefits of the invention, namely a small diameter objective configured for use in existing microscopes having the ability to perform well in broadband light energy conditions with high NA and enhanced field size. While the invention has thus been described in connection with specific embodiments thereof, it will be understood that the invention is capable of further modifications. This application is intended to cover any variations, uses or adaptations of the invention following, in general, the principles of the invention, and including such departures from the present disclosure as come within known and customary practice within the art to which the invention pertains.

What is claimed is:

1. An objective comprising:
   a focusing lens group comprising at least one focusing lens configured to receive light energy from a light energy source configured to provide light energy in a wavelength range of 480 to 660 nanometers and form focused light energy;
   a field lens oriented to receive focused light energy from said focusing lens group and provide intermediate light energy;
   a Mangin mirror arrangement positioned to receive the intermediate light energy from the field lens and form controlled light energy; and
   an immersion liquid between the Mangin mirror arrangement and a specimen;
   wherein every element in the objective is substantially aligned along a single axis and has a diameter less than 40 millimeters and the objective is configured to provide a numerical aperture in excess of 1.0 and a field size in excess of 0.05 millimeters.

2. The objective of claim 1, wherein said objective provides a relative bandwidth in excess of 0.2 in the presence of said light energy.

3. The objective of claim 1 where more than one glass material is used.

4. The objective of claim 3, said Mangin mirror arrangement comprising:
   a first lens/mirror element having a substantially flat surface in contact with the immersion liquid and a second surface curved toward the specimen; and
   a second lens/mirror element having a first surface reflection.

5. The objective of claim 4, wherein said second lens/mirror element further has a central hole to allow focused light energy to pass therethrough.

6. The objective of claim 4, wherein the second lens/mirror element is formed of a curved reflective surface formed on a lens having a substantially flat side opposite the curved reflective surface.

7. The objective of claim 3, configured to have a field size in excess of 0.20 millimeters.

8. The objective of claim 3, configured to have a field size in excess of 0.250 millimeters.

9. The objective of claim 3, configured to have a numerical aperture in excess of 1.2 and a field size in excess of 0.20 millimeters.

10. The objective of claim 3, wherein one of the glass materials is fused silica.

11. The objective of claim 3, wherein one of the glass materials is calcium fluoride.

12. The objective of claim 3, wherein one of the glass materials is BK7.

13. The objective of claim 1, wherein each lens in the focusing lens group and the field lens each has a diameter of at most 40 millimeters.

14. The objective of claim 1, wherein said objective, including the field lens, the focusing lens group, and the Mangin mirror arrangement comprise no more than eight elements.

15. The objective of claim 1, wherein said objective is employed with a microscope having a flange, wherein the flange is configured to be located approximately 60 millimeters from the specimen.

16. An objective employed for use in inspecting a specimen, comprising:
   a focusing lens group configured to receive broadband light energy in a wavelength range of 480 to 660 nanometers, the focusing lens group comprising at least one focusing lens;
   at least one field lens oriented to receive focused light energy from said focusing lens group and provide intermediate light energy;
   a Mangin mirror arrangement positioned to receive the intermediate light energy from the field lens and form controlled light energy; and
   an immersion substance located between said Mangin mirror arrangement and said specimen;
   wherein the focusing lens group, at least one field lens, and Mangin mirror arrangement are substantially aligned along a single axis, and said Mangin mirror arrangement is configured to impart the controlled light energy to the specimen with a numerical aperture in excess of 1.0 and a field size of greater than approximately 0.05 millimeters.

17. The objective of claim 16, wherein said objective provides a relative bandwidth in excess of 0.3 in the presence of said broadband light energy.

18. The objective of claim 17, wherein the immersion substance is primarily water.

19. The objective of claim 17, wherein the immersion substance is index matching liquid with a dispersion close to that of fused silica.

20. The objective of claim 17, wherein the immersion substance is index matching liquid with a dispersion close to that of calcium fluoride.

21. The objective of claim 17, wherein the immersion substance is index matching liquid with a dispersion close to that of BK7.

22. The objective of claim 17, wherein the objective is optimized to produce relatively minimal spherical aberration, axial color, lateral color, and chromatic variation of aberrations.

23. The objective of claim 22, wherein the objective is optimized to allow residual lateral color.

24. The objective of claim 16 where more than one glass material is used in the objective.

25. The objective of claim 24, said Mangin mirror arrangement comprising:
   a first lens/mirror element having a substantially flat surface in contact with the immersion liquid and a second surface curved toward the specimen; and
   a second lens/mirror element having a first surface reflection.

26. The objective of claim 24, wherein one glass material is fused silica.

27. The objective of claim 24, wherein one glass material is calcium fluoride.

28. The objective of claim 24, wherein one glass material is BK7.

29. The objective of claim 16, wherein each element in the objective has a diameter of less than 40 millimeters.

30. The objective of claim 16, wherein said objective has at most seven elements.

31. The objective of claim 16, wherein said objective comprises less than nine elements.

32. The objective of claim 16, wherein said objective is configured to be located in a flange within a microscope, said flange positioned no more than 60 millimeters from the specimen during normal operation.

33. A method for inspecting a specimen, comprising:
providing light energy having a wavelength in the range of the visible light spectrum in excess of 480 nanometers;
focusing said light energy using at least one lens into focused light energy, where each lens used in said focusing is axially aligned and has diameter less than 40 millimeters;
receiving said focused light energy and converting said focused light energy into intermediate light energy; and
receiving said intermediate light energy and providing controlled light energy through an immersion substance to a specimen;
wherein controlled light energy is configured to be provided by an objective at a numerical aperture in excess of 1.0 and a field size in excess of 0.05 millimeters.

* * * * *